United States Patent
Ishii et al.

(10) Patent No.: US 10,175,553 B2
(45) Date of Patent: Jan. 8, 2019

(54) OPTICAL MODULE

(71) Applicant: Fujitsu Optical Components Limited, Kawasaki-shi, Kanagawa (JP)

(72) Inventors: Akira Ishii, Yokohama (JP); Shinji Maruyama, Sapporo (JP); Yuki Sakurai, Kawasaki (JP); Masaharu Doi, Sapporo (JP); Osamu Oyama, Sapporo (JP); Masami Kamioka, Tochigi (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 101 days.

(21) Appl. No.: 15/384,854

(22) Filed: Dec. 20, 2016

(65) Prior Publication Data

US 2017/0212402 A1  Jul. 27, 2017

(30) Foreign Application Priority Data

Jan. 25, 2016 (JP) ................. 2016-011913

(51) Int. Cl.

| | | |
|---|---|---|
| *G02F 1/225* | (2006.01) | |
| *G02B 6/126* | (2006.01) | |
| *H01R 9/05* | (2006.01) | |
| *H01R 12/51* | (2011.01) | |
| *H01R 12/59* | (2011.01) | |
| *H01R 12/79* | (2011.01) | |
| *H01R 24/38* | (2011.01) | |
| *H01R 12/70* | (2011.01) | |
| *H01R 24/50* | (2011.01) | |

(52) U.S. Cl.
CPC ........... *G02F 1/2255* (2013.01); *G02B 6/126* (2013.01); *H01R 9/0515* (2013.01); *H01R 12/515* (2013.01); *H01R 12/592* (2013.01); *H01R 12/7076* (2013.01); *H01R 12/79* (2013.01); *H01R 24/38* (2013.01); *H01R 24/50* (2013.01); *G02F 2201/12* (2013.01)

(58) Field of Classification Search
None
See application file for complete search history.

(56) References Cited

FOREIGN PATENT DOCUMENTS

| | | |
|---|---|---|
| JP | 2005-128440 | 5/2005 |
| JP | 2008-193353 | 8/2008 |

*Primary Examiner* — Chad H Smith

(57) ABSTRACT

An optical module includes a driver that generates an electric signal and an optical modulator that has a notch in which at least a portion of the driver is accommodated and performs optical modulation using an electric signal generated by the driver. The optical module also includes a first connector electrically connected to the driver in the notch of the optical modulator. The optical module further includes a second connector provided on a surface of the notch of the optical modulator, the surface being opposed to the first connector. The second connector is electrically connected to the optical modulator. Furthermore, the optical module includes a coaxial pin that is connected to the first connector and the second connector and transmits the electric signal generated by the driver to the optical modulator.

8 Claims, 23 Drawing Sheets

OPTICAL MODULE

CROSS-REFERENCE TO RELATED APPLICATION

This application is based upon and claims the benefit of priority of the prior Japanese Patent Application No. 2016-011913, filed on Jan. 25, 2016, the entire contents of which are incorporated herein by reference.

FIELD

The embodiments discussed herein are related to an optical module.

BACKGROUND

Conventionally, a Mach-Zehnder interferometer is sometimes used in an optical modulator that modulates light generated in a light source. In this optical modulator, a signal electrode and a ground electrode are provided along parallel optical waveguides. In recent years, the optical modulator often includes a plurality of Mach-Zehnder interferometers because optical modulation methods are diversified. In this case, integration of the plurality of Mach-Zehnder interferometers into one chip can reduce a size of the optical modulator.

The optical modulator including the plurality of Mach-Zehnder interferometers can generate a multilevel modulation signal by receiving a plurality of different electric signals input thereto. In other words, the different electric signals are input from an outside to signal electrodes respectively corresponding to the Mach-Zehnder interferometers, so that optical modulation by a multilevel modulation technique, such as a DQPSK (Differential Quadrature Phase Shift Keying) method, can be performed.

In some cases, a unit at which an electric signal is input to the optical modulator and a driver that generates the electric signal to the optical modulator are connected to each other by an flexible printed circuit (FPC) having flexibility.

Specifically, a plurality of wiring patterns are printed on the FPC, which respectively correspond to the plurality of signal electrodes of the optical modulator. The electric signals output from the driver are input to the optical modulator via the wiring patterns printed on the FPC. A driver-side end of the FPC is electrically connected to the driver by being soldered to an electrode pattern to which each wiring pattern outputs the electric signal from the driver, for example. Also, an optical-modulator-side end of the FPC is inserted into a notch formed in a package of the optical modulator, and each wiring pattern is soldered to a coaxial terminal projecting downward from an upper surface of the notch, for example. Due to this configuration, the optical-modulator-side end is electrically connected to the optical modulator.

From a viewpoint of downsizing of a device, a structure is sometimes used in which the optical modulator and the driver are hierarchically arranged by using different substrates and are connected by the FPC.

However, in the structure in which the optical modulator and the driver hierarchically arranged are connected by the FPC, an arrangement space for the optical modulator and an arrangement space for the driver are separated from each other. This structure may increase a mounting area of the entire device. Therefore, the structure in which the optical modulator and the driver are hierarchically arranged is not practical.

It can be considered that a portion of the driver is accommodated in the notch formed in the package of the optical modulator to reduce a mounting area corresponding to the driver. However, in this case, the coaxial terminal projecting into the notch and the driver are arranged to be close to each other, causing sharp bending of the FPC that connects the coaxial terminal and the electrode pattern extending from the driver. The bending of the FPC causes increase in the length of the FPC in order to absorb the bending.

The electric signal supplied from the driver to the optical modulator via the FPC is a high-frequency signal. Therefore, in a case where the electric signal is transmitted by the FPC, it is known that attenuation of the electric signal increases as the FPC becomes longer. In other words, in a case where the portion of the driver is accommodated in the notch formed in the package of the optical modulator, when the optical modulator and the driver are connected by using the FPC, the mounting area is reduced. However, there is a problem that high-frequency characteristics of the electric signal supplied to the optical modulator are deteriorated.

SUMMARY

According to an aspect of an embodiment, an optical module includes a driver that generates an electric signal; an optical modulator that includes a notch in which at least a portion of the driver is accommodated, and performs optical modulation using the electric signal generated by the driver; a first connector that is electrically connected to the driver in the notch of the optical modulator; a second connector that is provided on a surface of the notch of the optical modulator and is electrically connected to the optical modulator, the surface being opposed to the first connector; and a coaxial pin that is connected to the first connector and the second connector and transmits the electric signal generated by the driver to the optical modulator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The disclosed techniques are not limited to the embodiments.

[a] First Embodiment

Figure 1:
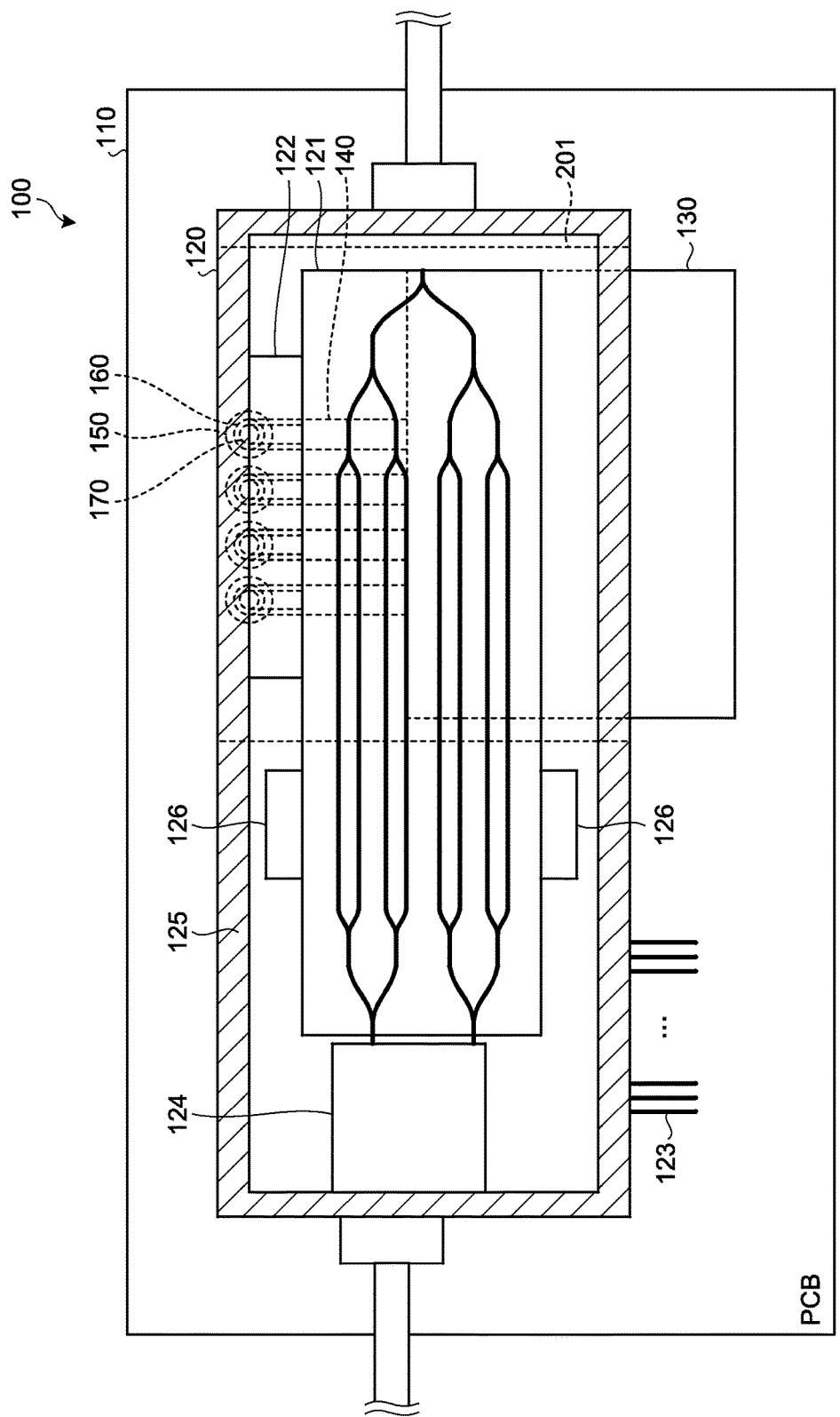
FIG. 1 is a schematic plan view illustrating a configuration of an optical module according to a first embodiment.

FIG. 1 is a schematic plan view illustrating a configuration of an optical module according to a first embodiment. An optical module 100 illustrated in FIG. 1 includes a printed circuit board (PCB) 110, an optical modulator 120, a driver 130, an electrode pattern 140, a connector 150, a connector 160, and a coaxial pin 170.

The PCB 110 is a glass epoxy substrate, for example, and has various components constituting the optical module 100 mounted thereon.

The optical modulator 120 modulates light generated in a light source (not illustrated) to output an optical signal. In this operation, the optical modulator 120 performs optical modulation based on a high-frequency electric signal output from the driver 130. The optical modulator 120 also executes phase control of the optical signal based on a direct-current electric signal output from an LSI (Large Scale Integration) (not illustrated). Specifically, the optical modulator 120 includes a package 125, a modulator chip 121, a polarization beam combiner (PBC) 124, a relay substrate 122, a DC (Direct Current) terminal 123, and a termination substrate 126.

The package 125 accommodates therein various components constituting the optical modulator 120.

The modulator chip 121 is constituted by parallel optical waveguides, and a signal electrode and a ground electrode, and performs optical modulation to generate the optical signal while propagating the light from the light source by the optical waveguides. The modulator chip 121 has an RF (Radio Frequency) electrode for inputting the high-frequency electric signal output from the driver 130 and a DC electrode for inputting the direct-current electric signal output from the LSI, as the signal electrode. The modulator chip 121 performs optical modulation based on the electric signal input to the RF electrode, and executes phase control of the optical signal based on the electric signal input to the DC electrode.

The optical waveguides are formed by forming a film of metal, such as titanium (Ti), on a portion of a crystal substrate using electro-optical crystal, such as lithium niobate ($LiNbO_3$ (LN)) or lithium tantalate ($LiTaO_3$), and performing thermal diffusion, for example. The optical waveguides may be formed by performing patterning and then exchanging protons in benzoic acid. Meanwhile, the signal electrode and the ground electrode are coplanar electrodes formed along the parallel optical waveguides. In FIG. 1, four sets of parallel optical waveguides are formed in the modulator chip 121, and therefore the signal electrode and the ground electrode are formed to correspond to each set of optical waveguides. The signal electrode and the ground electrode are patterned on the corresponding optical waveguides. In addition, a buffer layer is provided between the crystal substrate, and the signal electrode and the ground electrode in order to prevent absorption of the light propagated through the optical waveguides by the signal electrode and the ground electrode. As the buffer layer, a silicon dioxide ($SiO_2$) layer with a thickness of about 0.2 to 2 μm can be used, for example.

The PBC 124 multiplexes two optical signals output from the modulator chip 121 and outputs an optical signal including two polarized waves with polarization directions thereof perpendicular to each other. In other words, the PBC 124 rotates the polarization direction of one of the optical signals output from the modulator chip 121 and then multiplexes the one with the other optical signal.

The relay substrate 122 relays the electric signal output from the driver 130 to the modulator chip 121 and inputs it to the signal electrode (that is, the RF electrode) of the modulator chip 121. In FIG. 1, the relay substrate 122 has four wiring patterns corresponding to four signal electrodes formed in the modulator chip 121. In a case where electric signals are input to the plurality of signal electrodes formed in the modulator chip 121, when all input units for the electric signals are arranged on one side of the optical modulator 120, mounting of the input units is facilitated, and a mounting area of the input units can be reduced. Therefore, the present embodiment employs a configuration in which the relay substrate 122 is arranged in the optical modulator 120 and relays the electric signals input from one side of the optical modulator 120 to the modulator chip 121.

The DC terminal 123 is a terminal to which the direct-current electric signal output from the LSI is input. A plurality of DC terminals 123 are provided on a side surface of the optical modulator 120 to correspond to the number of the DC electrodes of the modulator chip 121. The electric signal input to the DC terminal 123 is input to the signal electrode (that is, the DC electrode) of the modulator chip 121, so that phase control of the optical signal obtained in the modulator chip 121 is executed.

The termination substrate 126 is connected to an end terminal of the RF electrode of the modulator chip 121, and has a function of suppressing reflection of the high-frequency electric signal (that is, an RF signal) by electrically terminating the RF signal input to the RF electrode. The termination substrate 126 is also referred to as "bias tee". The termination substrate 126 has a resistor component and a capacitor component (both not illustrated) mounted thereon. Due to these components, reflection of the RF signal is suppressed. In a case where the optical modulator 120 is a DP-QPSK (Dual Polarization-Quadrature Phase Shift Keying) modulator, a plurality of termination substrates 126 need to be provided. In this case, when the plurality of termination substrates 126 are arranged on one side of the modulator chip 121, a size of the optical modulator 120 in a longitudinal direction increases. Therefore, in the example illustrated in FIG. 1, the termination substrates 126 are arranged on both sides of the modulator chip 121. This arrangement suppresses the increase in the size of the optical modulator 120 in the longitudinal direction.

The driver 130 generates an electric signal for optically modulating the light from the light source. More specifically, the driver 130 generates a high-frequency electric signal with an amplification and a phase corresponding to transmission data, and drives the optical modulator 120 by using this electric signal. A portion of the driver 130 is accommodated in a notch 201 formed in the optical modulator 120 in the vicinity of the PCB 110. Due to this configuration, a mounting area corresponding to the driver 130 is reduced.

The electrode pattern 140 is an electrode pattern that is printed on the PCB 110, and propagates the electric signal output from the driver 130 to the connector 150.

The connector 150 is fixed to the PCB 110 and is configured to allow one end of the coaxial pin 170 to be inserted thereto and removed therefrom. The connector 150 is electrically connected to the driver 130 via the electrode pattern 140 on the PCB 110 in the notch 201 of the optical modulator 120. The connector 150 and the driver 130 are soldered to each other, for example. Further, the connector 150 has a coaxial terminal provided therein. When the coaxial pin 170 and the coaxial terminal of the connector 150 come into contact with each other, the coaxial pin 170 and the driver 130 are electrically connected to each other. As the connector 150, a push-on connector is used, for example.

The connector 160 is provided on a surface of the notch 201 of the optical modulator 120, the surface being opposed to the connector 150. The connector 160 is configured to allow one end of the coaxial pin 170 to be inserted thereto and removed therefrom. The connector 160 is provided with a coaxial terminal projecting to the inside of the optical modulator 120. By electric connection of the relay substrate 122 in the optical modulator 120 and the coaxial terminal of the connector 160, the connector 160 and the optical modulator 120 are electrically connected to each other. Further, by contact of the coaxial pin 170 and the coaxial terminal of the connector 160, the coaxial pin 170 and the optical modulator 120 are electrically connected to each other. As the connector 160, a push-on connector is used, for example.

The coaxial pin 170 is formed by coating a signal line for an electric signal with an insulation member for grounding, and is connected to the connector 150 and the connector 160 to propagate the electric signal output from the driver 130 to the optical modulator 120. In other words, one end of the coaxial pin 170 is electrically connected to the driver 130 via the connector 150 and the electrode pattern 140, and the other end of the coaxial pin 170 is electrically connected to the relay substrate 122 of the optical modulator 120 via the connector 160.

Figure 2:
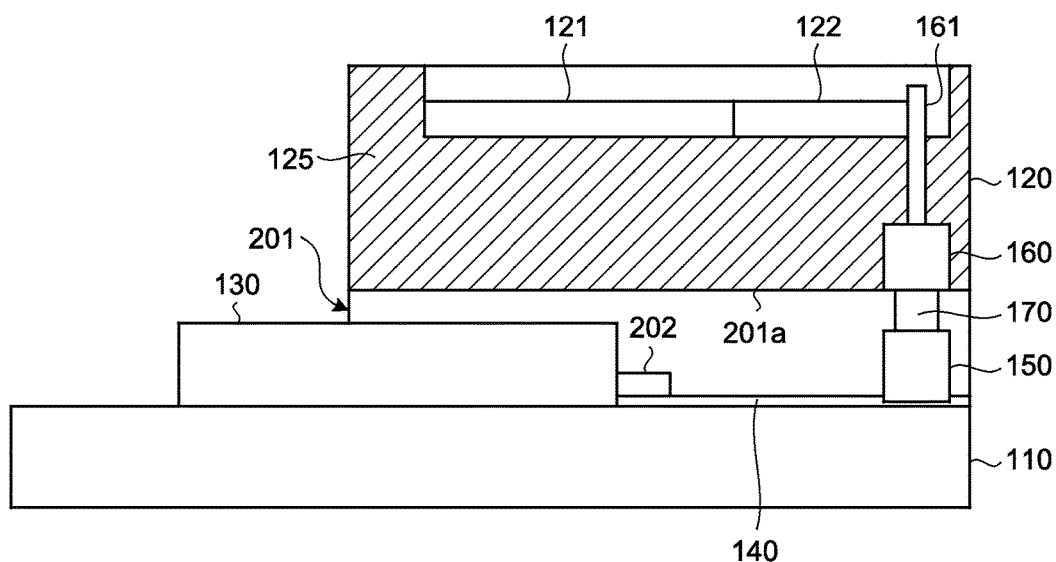
FIG. 2 is a schematic side cross-sectional view illustrating the configuration of the optical module according to the first embodiment.

Next, electrical connection of the optical modulator 120, the driver 130, the connector 150, the connector 160, and the coaxial pin 170 is described with reference to FIG. 2. FIG. 2 is a schematic side cross-sectional view illustrating the configuration of the optical module according to the first embodiment.

As illustrated in FIG. 2, the notch 201 is formed in the package 125 of the optical modulator 120 in the vicinity of the PCB 110. A portion of the driver 130 is accommodated in the notch 201. The connector 150 is fixed to the PCB 110 with an insertion port thereof facing a thickness direction of the PCB 110 (that is, a direction perpendicular to the PCB 110) in the notch 201 of the package 125 of the optical modulator 120. The connector 150 is electrically connected to the driver 130 via the electrode pattern 140 on the PCB 110 by being soldered to the electrode pattern 140 on the PCB 110.

The driver 130 and the electrode pattern 140 are electrically connected to each other by soldering of a lead pin 202 projecting from the driver 130 to the electrode pattern 140.

The connector 160 is provided on a surface 201a of the notch 201, which is opposed to the connector 150, of the package 125 of the optical modulator 120 with an insertion port of the connector 160 facing the thickness direction of the PCB 110 (that is, the direction perpendicular to the PCB 110). The connector 160 is electrically connected to the optical modulator 120. In other words, a coaxial terminal 161 projecting from the connector 160 to the inside of the optical modulator 120 and a wiring pattern formed on the relay substrate 122 in the optical modulator 120 are soldered to each other, so that the connector 160 and the optical modulator 120 are electrically connected to each other. Details of a connecting portion between the connector 160 and the optical modulator 120 are described later.

The coaxial pin 170 is connected to the connector 150 and the connector 160 by being inserted into the insertion port of the connector 150 and the insertion port of the connector 160. By contact of the coaxial pin 170 and the coaxial terminal of the connector 150 inside the connector 150, the coaxial pin 170 and the connector 150 are electrically connected to each other. Also, by contact of the coaxial pin 170 and the coaxial terminal 161 of the connector 160 inside the connector 160, the coaxial pin 170 and the connector 160 are electrically connected to each other. Consequently, the optical modulator 120 and the driver 130 are electrically connected to each other via the connector 150, the connector 160, and the coaxial pin 170.

As described above, the connector 150 and the connector 160 that are mutually opposed are connected to each other by the coaxial pin 170. Therefore, the length of the coaxial pin 170 can be minimized, so that attenuation of an electric signal in the coaxial pin 170 can be reduced and high-frequency characteristics of the electric signal can be improved.

Figure 3:
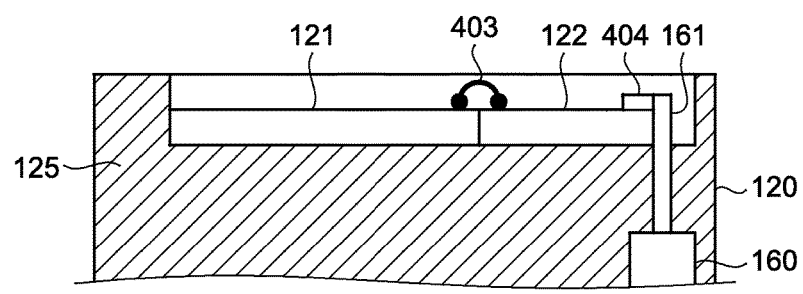
FIG. 3 is a schematic side cross-sectional view illustrating an example of a connecting portion between a connector and an optical modulator.
Figure 4:
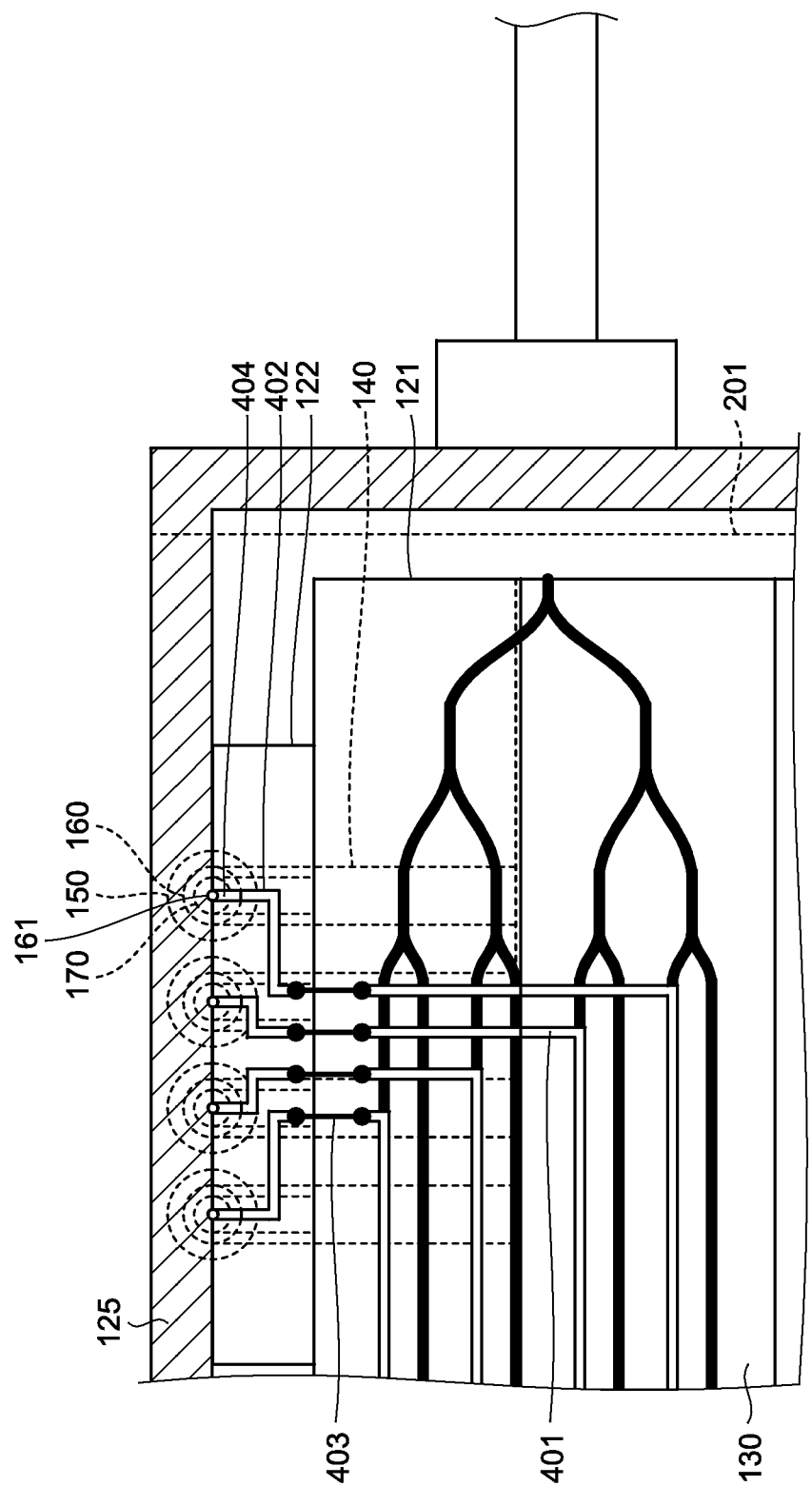
FIG. 4 is a schematic plan view illustrating the example of the connecting portion between the connector and the optical modulator.

Next, the details of the connecting portion between the connector 160 and the optical modulator 120 are described. FIG. 3 is a schematic side cross-sectional view illustrating an example of a connecting portion between a connector and an optical modulator. FIG. 4 is a schematic plan view illustrating the example of the connecting portion between the connector and the optical modulator.

As illustrated in FIGS. 3 and 4, RF electrodes 401 are formed on the modulator chip 121, and wiring patterns 402 corresponding to the respective RF electrodes 401 are formed on the relay substrate 122. The RF electrodes 401 and the wiring patterns 402 are connected by conductive wires 403, respectively. In the present embodiment, each of four RF electrodes 401 on the modulator chip 121 and a corresponding one of four wiring patterns 402 on the relay substrate 122 are connected to each other by the conductive wire 403. The conductive wire 403 is electrically conductive and is formed of metal, such as gold, aluminum, and copper. The four wiring patterns 402 on the relay substrate 122 are subjected to pitch conversion on the relay substrate 122, so that a pitch between the wiring patterns is smaller on a side close to the modulator chip 121 but is larger on a side close to the connector 160. In other words, the four wiring patterns 402 on the relay substrate 122 convert a pitch between the RF electrodes 401 to a pitch between the connectors 160. Further, a ground electrode (not illustrated) is arranged on the modulator chip 121, and a ground pattern (not illustrated) corresponding to the ground electrode is arranged on the relay substrate 122. The ground electrode and the ground pattern are connected to each other by a conductive wire (not illustrated).

The coaxial terminal 161 of the connector 160 is soldered to the relay substrate 122. In other words, the coaxial terminal 161 projects from the connector 160 to the inside of the optical modulator 120. The coaxial terminal 161 is connected to the wiring pattern 402 on the relay substrate 122 by solder 404. Due to this configuration, the connector 160 and the optical modulator 120 (that is, the modulator chip 121 and the relay substrate 122) are electrically connected to each other.

In the examples illustrated in FIGS. 3 and 4, the coaxial terminal 161 of the connector 160 is soldered to the relay substrate 122. However, a manner of electrically connecting the connector 160 and the relay substrate 122 to each other is not limited to soldering. For example, the coaxial terminal 161 of the connector 160 may be brazed to the relay substrate 122.

Figure 5:
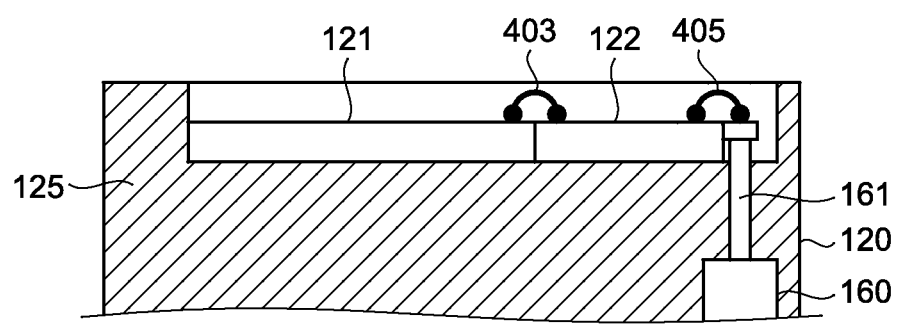
FIG. 5 is a schematic side cross-sectional view illustrating another example of the connecting portion between the connector and the optical modulator.
Figure 6:
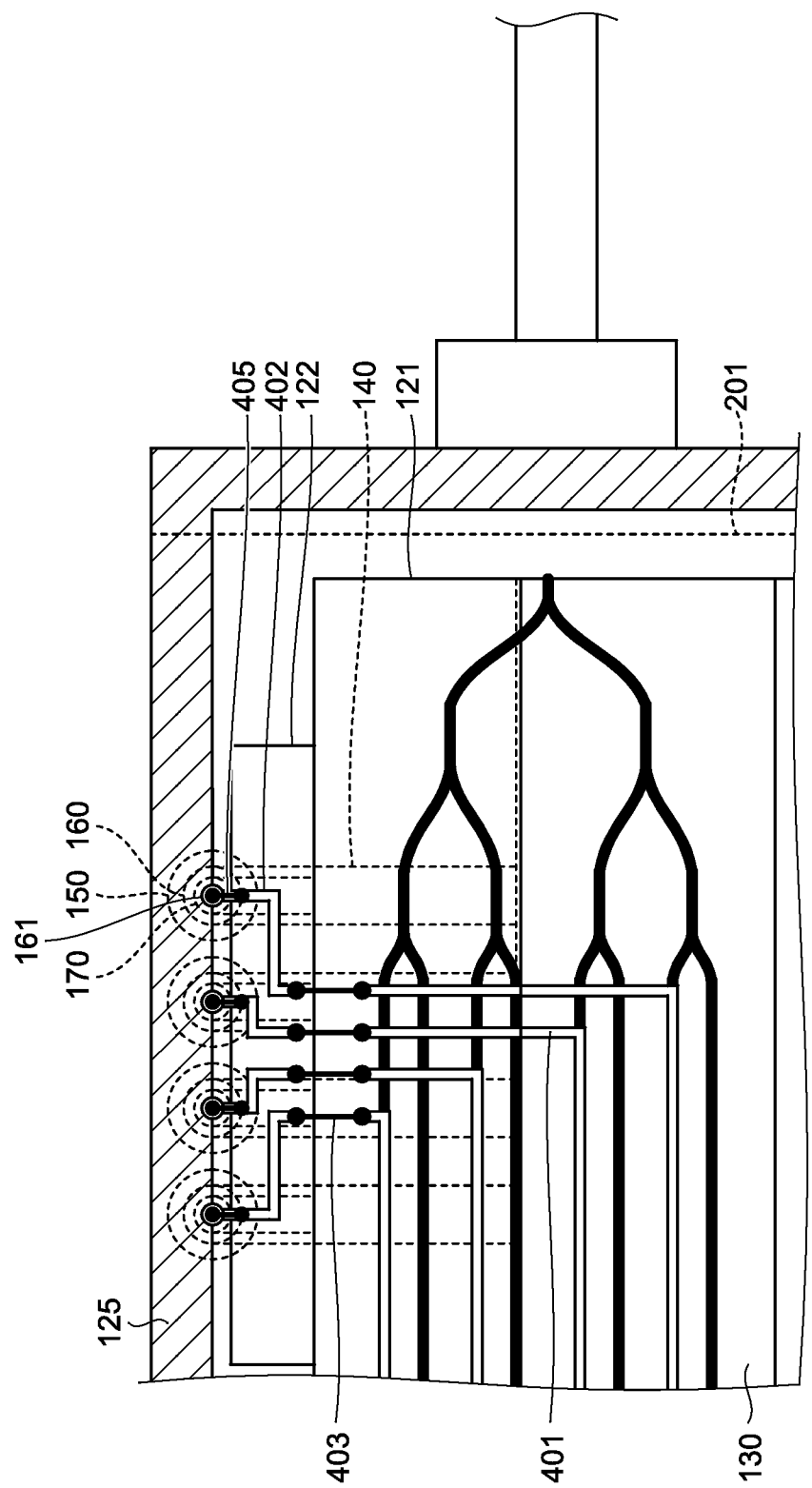
FIG. 6 is a schematic plan view illustrating the another example of the connecting portion between the connector and the optical modulator.

Further, as illustrated in FIGS. 5 and 6, for example, the coaxial terminal 161 of the connector 160 may be connected to the relay substrate 122 by using wire bonding. FIG. 5 is a schematic side cross-sectional view illustrating another example of the connecting portion between the connector and the optical modulator. FIG. 6 is a schematic plan view illustrating the another example of the connecting portion between the connector and the optical modulator.

In the example illustrated in FIGS. 5 and 6, a cross-sectional area of the coaxial terminal 161 projecting to the inside of the optical modulator 120 is converted inside the optical modulator 120. In other words, the cross-sectional area of the coaxial terminal 161 at one end close to the inside of the optical modulator 120 is larger than that at the other end close to the inside of the connector 160. The coaxial terminal 161 is connected to the wiring pattern 402 on the relay substrate 122 by a conductive wire 405. The conductive wire 405 is electrically conductive and is formed of metal, such as gold, aluminum, and copper. By this connection of the coaxial terminal 161 of the connector 160 to the relay substrate 122 by using wire bonding, the connector 160 and the optical modulator 120 (that is, the modulator chip 121 and the relay substrate 122) are electrically connected to each other.

As described above, according to the present embodiment, a portion of a driver is accommodated in a notch formed in a package of an optical modulator, a coaxial pin is connected to a pair of connectors that are mutually opposed in the notch, and an electric signal output from the driver is transmitted to the optical modulator. Therefore, the length of the coaxial pin can be minimized, and attenuation of the electric signal can be reduced as compared with a case where the optical modulator and the driver are connected by using an FPC. Consequently, it is possible to improve high-frequency characteristics of the electric signal supplied to the optical modulator while reducing a mounting area corresponding to the driver.

[b] Second Embodiment

A second embodiment has a feature in that a coaxial pin is connected to a pair of connectors in a notch of an optical modulator while insertion ports of the connectors face a direction crossing a thickness direction of a PCB, to improve high-frequency characteristics of an electric signal.

Configurations of the optical module 100 according to the second embodiment are basically identical to those of the first embodiment, and explanations of parts common to those of the first embodiment will be omitted. The second embodiment is different from the first embodiment in an arrangement of the pair of connectors and a manner of connecting the pair of connectors by using the coaxial pin.

Figure 7:
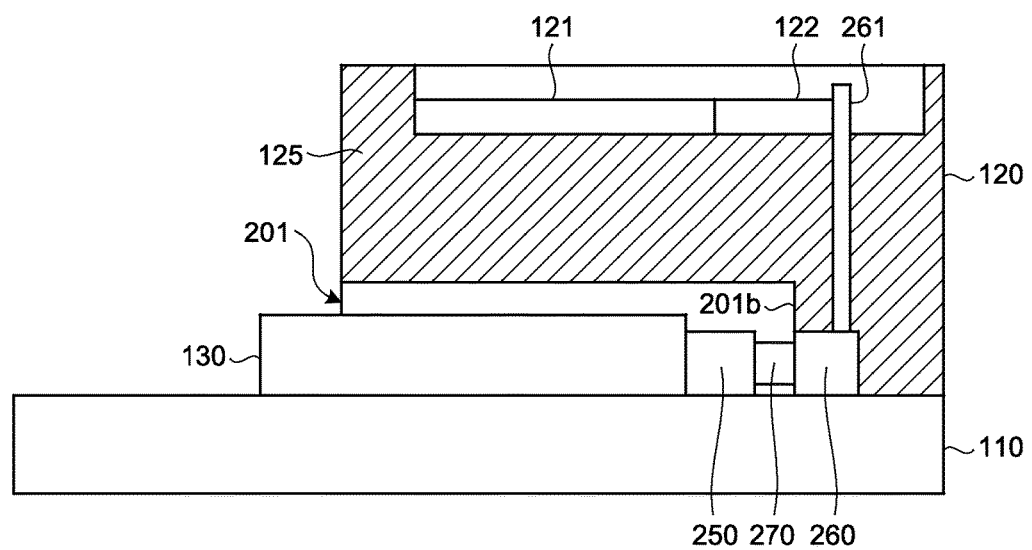
FIG. 7 is a schematic side cross-sectional view illustrating a configuration of an optical module according to a second embodiment.

FIG. 7 is a schematic side cross-sectional view illustrating a configuration of an optical module according to the second embodiment. Parts in FIG. 7 identical to those in FIGS. 1 and 2 are denoted by like reference signs.

As illustrated in FIG. 7, a connector 250 is fixed to the driver 130 with an insertion port thereof facing the direction crossing the thickness direction of the PCB 110 (that is, a direction parallel to the PCB 110) in the notch 201 of the package 125 of the optical modulator 120, and is electrically connected to the driver 130.

A connector 260 is provided on a surface 201b of the notch 201, which is opposed to the connector 250, of the package 125 of the optical modulator 120 with an insertion port of the connector 260 facing the direction crossing the thickness direction of the PCB 110 (that is, the direction parallel to the PCB 110), and is electrically connected to the optical modulator 120. More specifically, a coaxial terminal 261 projecting from the connector 260 to the inside of the optical modulator 120 is soldered to a wiring pattern formed on the relay substrate 122 in the optical modulator 120, so that the connector 260 and the optical modulator 120 are electrically connected to each other.

A coaxial pin 270 is connected to the connector 250 and the connector 260 by being inserted into the insertion port of the connector 250 and the insertion port of the connector 260. Also, by contact of the coaxial pin 270 and a coaxial terminal of the connector 250 inside the connector 250, the coaxial pin 270 and the connector 250 are electrically connected to each other. Further, by contact of the coaxial pin 270 and a coaxial terminal 261 of the connector 260 inside the connector 260, the coaxial pin 270 and the connector 260 are electrically connected to each other. Due to this configuration, the optical modulator 120 and the driver 130 are electrically connected to each other via the connector 250, the connector 260, and the coaxial pin 270.

As described above, the connector 250 and the connector 260 mutually opposed along the direction parallel to the PCB 110 are connected to each other by the coaxial pin 270. Therefore, the length of the coaxial pin 270 can be minimized. Also, attenuation of an electric signal in the coaxial pin 270 can be reduced, so that high-frequency characteristics of the electric signal can be improved. Further, because the connector 250 is directly fixed to the driver 130, an electric resistance between the connector 250 and the driver 130 can be reduced. This configuration can further improve the high-frequency characteristics of the electric signal.

As described above, according to the present embodiment, a coaxial pin is connected to one connector that is fixed to a driver with an insertion port thereof facing a direction parallel to a PCB, and to the other connector that is fixed to a surface of a notch of an optical modulator, the surface being opposed to the one connector. Therefore, the length of the coaxial pin can be minimized, and attenuation of an electric signal can be reduced as compared with a case where the optical modulator and the driver are connected to each other by using an FPC. Consequently, it is possible to improve high-frequency characteristics of the electric signal supplied to the optical modulator while reducing a mounting area corresponding to the driver.

Further, because the connector is directly fixed to the driver, an electric resistance between the connector and the driver can be reduced. This configuration can further improve the high-frequency characteristics of the electric signal.

[c] Third Embodiment

A third embodiment has a feature in that another notch is formed in a package of an optical modulator, and a DC terminal is arranged to project to the another notch and is electrically connected to an electrode pattern on a PCB in the another notch.

Figure 8:
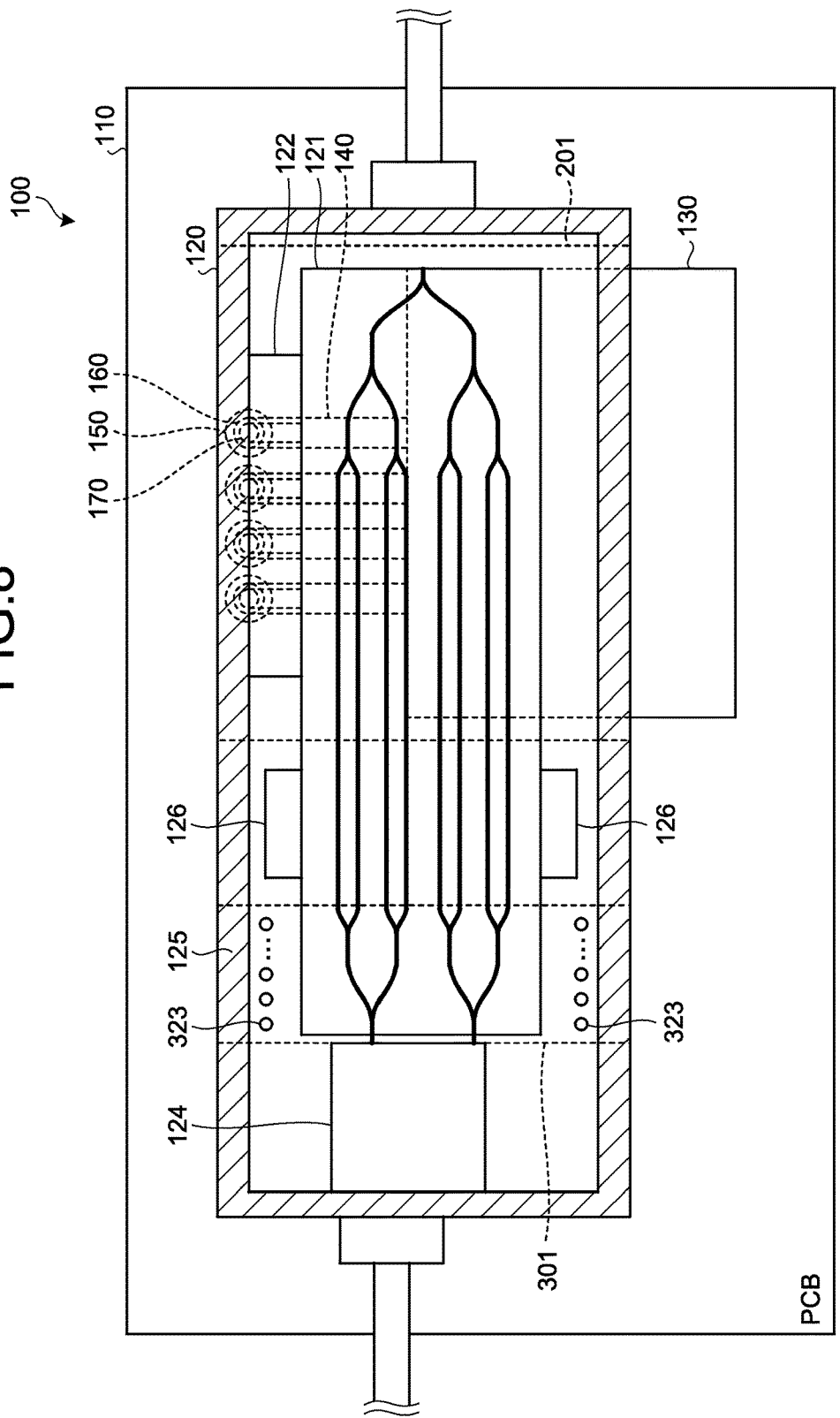
FIG. 8 is a schematic plan view illustrating a configuration of an optical module according to a third embodiment.

FIG. 8 is a schematic plan view illustrating a configuration of an optical module according to the third embodiment. Parts in FIG. 8 identical to those in FIG. 1 are denoted by like reference signs and explanations thereof will be omitted.

As illustrated in FIG. 8, another notch 301 that is different from the notch 201 is formed in the package 125 of the optical modulator 120 in the vicinity of the PCB 110. From the optical modulator 120, a DC terminal 323 projects to the another notch 301. The DC terminal 323 is a terminal to which a direct-current electric signal output from an LSI is input. The optical modulator 120 is provided with a plurality of DC terminals 323 in accordance with the number of DC electrodes of the modulator chip 121. The electric signal input to the DC terminal 323 is input to a signal electrode (that is, the DC electrode) of the modulator chip 121, so that phase control of an optical signal obtained in the modulator chip 121 is executed. Further, the DC terminal 323 is electrically connected to an electrode pattern on the PCB 110 in the another notch 301 of the package 125 of the optical modulator 120.

Figure 9:
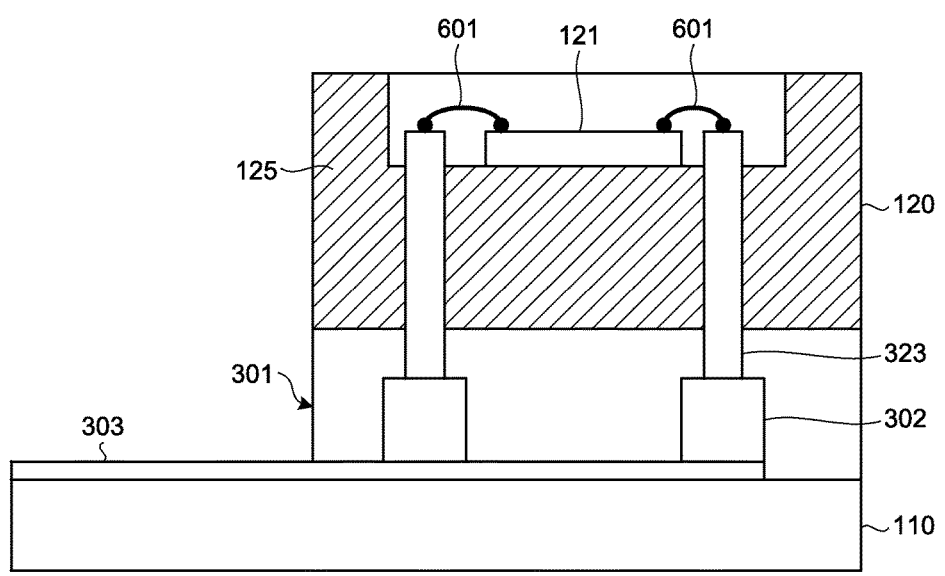
FIG. 9 is a schematic side cross-sectional view illustrating the configuration of the optical module according to the third embodiment.

Next, electrical connection between the optical modulator 120, the DC terminal 323, and the PCB 110 is described with reference to FIG. 9. FIG. 9 is a schematic side cross-sectional view illustrating the configuration of the optical module according to the third embodiment. As illustrated in FIG. 9, a connector 302 is fixed on the PCB 110. The DC terminal 323 projecting to the another notch 301 of the package 125 of the optical modulator 120 is connected to the connector 302 in the another notch 301. The connector 302 is connected to an LSI (not illustrated) via an electrode pattern 303 on the PCB 110. That is, the DC terminal 323 is connected to the electrode pattern 303 on the PCB 110 via the connector 302 in the another notch 301. Due to this configuration, the optical modulator 120 and the LSI are electrically connected to each other via the electrode pattern 303, the connector 302, and the DC terminal 323. As described above, the DC terminal 323 projects to the another notch 301 formed in a lower portion of the package 125 of the optical modulator 120, and the DC terminal 323 and the connector 302 on the PCB 110 are connected to each other. Therefore, a mounting area can be reduced, as compared with a configuration in which a DC terminal is provided on a side surface of the package 125 of the optical modulator 120.

Further, the DC terminal 323 and the modulator chip 121 of the optical modulator 120 are electrically connected to each other by using wire bonding. In other words, the DC terminal 323 is connected to the DC electrode of the modulator chip 121 via a conductive wire 601.

As described above, according to the present embodiment, another notch is formed in a lower portion of an optical modulator, and a DC terminal is arranged to project to the another notch and is electrically connected to an electrode pattern on a PCB in the another notch. Therefore, it is possible to reduce not only a mounting area corresponding to a driver but also a mounting area corresponding to the DC terminal, so that downsizing of the optical modulator is facilitated.

Figure 10:
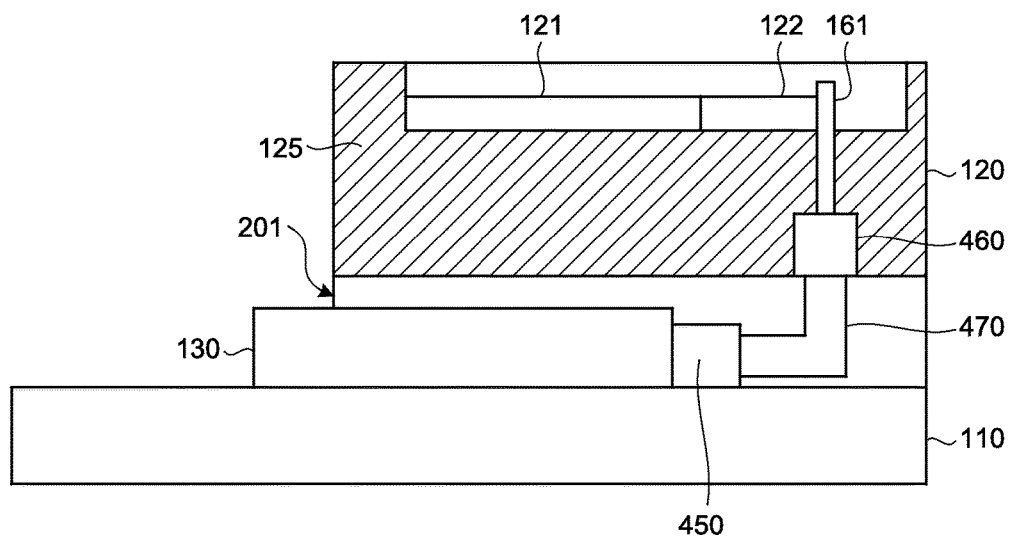
FIG. 10 is a diagram illustrating a modification of connection between a pair of connectors.

In each of the embodiments described above, a pair of connectors are arranged with insertion ports thereof facing a direction parallel to the PCB 110 or a direction perpendicular to the PCB 110, and are connected to each other by a coaxial pin. However, a configuration can be employed in which one of the connectors is arranged with the insertion port thereof facing the direction parallel to the PCB 110, the other connector is arranged with the insertion port thereof facing the direction perpendicular to the PCB 110, and both the connectors are connected to each other by the coaxial pin. More specifically, as illustrated in FIG. 10, for example, one connector 450 is fixed to the driver 130 with an insertion port thereof facing the direction parallel to the PCB 110 in the notch 201 of the optical modulator 120. The other connector 460 is provided on an upper surface of the notch 201 of the optical modulator 120 with an insertion port thereof facing the direction perpendicular to the PCB 110. In this case, the connector 450 and the connector 460 are connected to each other by an L-shaped coaxial pin 470. This configuration enables an optical module to be designed flexibly. FIG. 10 is a diagram illustrating a modification of connection between a pair of connectors.

Figure 11:
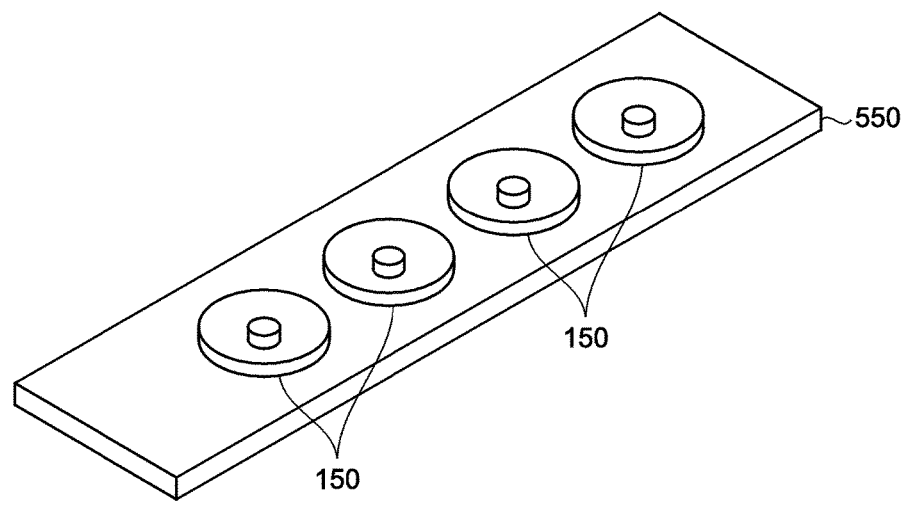
FIG. 11 is a diagram illustrating an example of a base member.

In addition, in the first embodiment described above, the connector 150 is directly fixed to the PCB 110. However, the connector 150 may be fixed to the PCB 110 via a base member 550 on which a plurality of connectors 150 are arranged in an array, as illustrated in FIG. 11. This configuration enables the connector 150 to be easily mounted onto the PCB 110, so that work efficiency when an optical module is assembled can be improved. FIG. 11 is a diagram illustrating an example of a base member.

Figure 12:
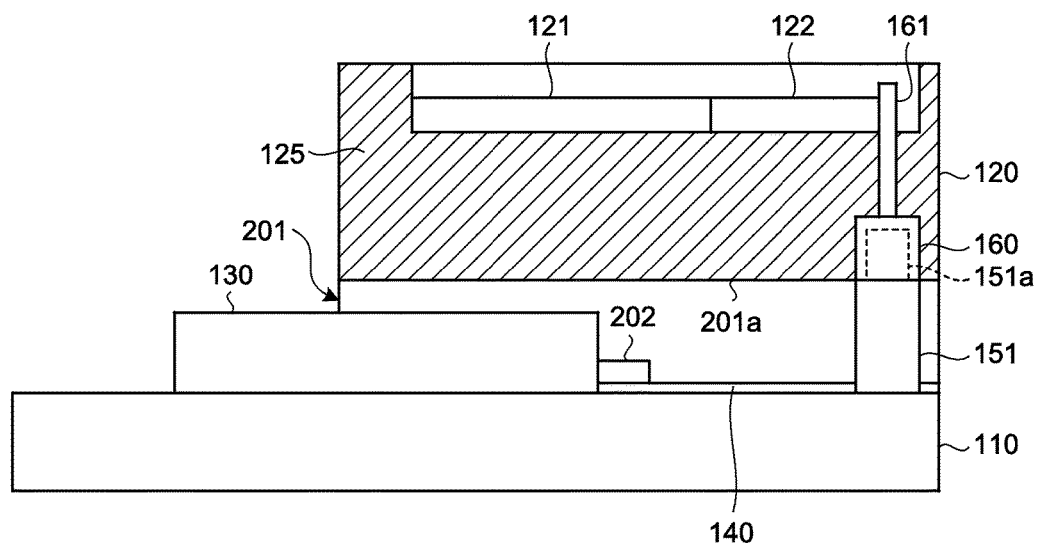
FIG. 12 is a diagram illustrating a first modification of connection between an optical modulator and a driver.

Also, in the first embodiment described above, the connector 150 and the coaxial pin 170 are formed separately from each other. However, the connector 150 and the coaxial pin 170 may be integrally formed with each other. In this case, as illustrated in FIG. 12, for example, a coaxial connector 151 obtained by integrally forming the connector 150 and the coaxial pin 170 with each other is fixed to the PCB 110. Further, the coaxial connector 151 is electrically connected to the driver 130 via the electrode pattern 140 on the PCB 110 in the notch 201 of the package 125 of the optical modulator 120. A coaxial terminal 151a projecting upward from the coaxial connector 151 is inserted into the insertion port of the connector 160, so that the coaxial connector 151 and the connector 160 are electrically connected to each other. Due to this configuration, electrical connection between the optical modulator 120 and the driver 130 is facilitated, so that assemblability of an optical module can be improved. FIG. 12 is a diagram illustrating a first modification of connection between an optical modulator and a driver.

Figure 13:
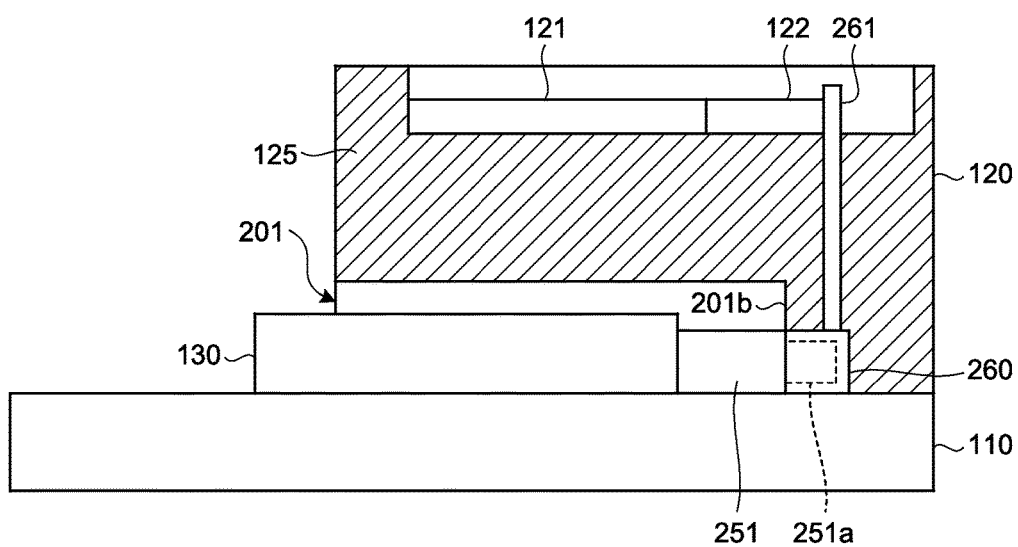
FIG. 13 is a diagram illustrating a second modification of the connection between the optical modulator and the driver.

In the second embodiment described above, the connector 250 and the coaxial pin 270 are formed separately from each other. However, the connector 250 and the coaxial pin 270 may be integrally formed with each other. In this case, as illustrated in FIG. 13, for example, a coaxial connector 251 obtained by integrally forming the connector 250 and the coaxial pin 270 with each other is fixed to the driver 130 and is electrically connected to the driver 130. Further, a coaxial terminal 251a projecting from the coaxial connector 251 in a lateral direction is inserted into the insertion port of the connector 260, so that the coaxial connector 251 and the connector 260 are electrically connected to each other. Due to this configuration, electrical connection between the optical modulator 120 and the driver 130 can be facilitated, so that assemblability of an optical module can be improved. FIG. 13 is a diagram illustrating a second modification of the connection between the optical modulator and the driver.

Figure 14:
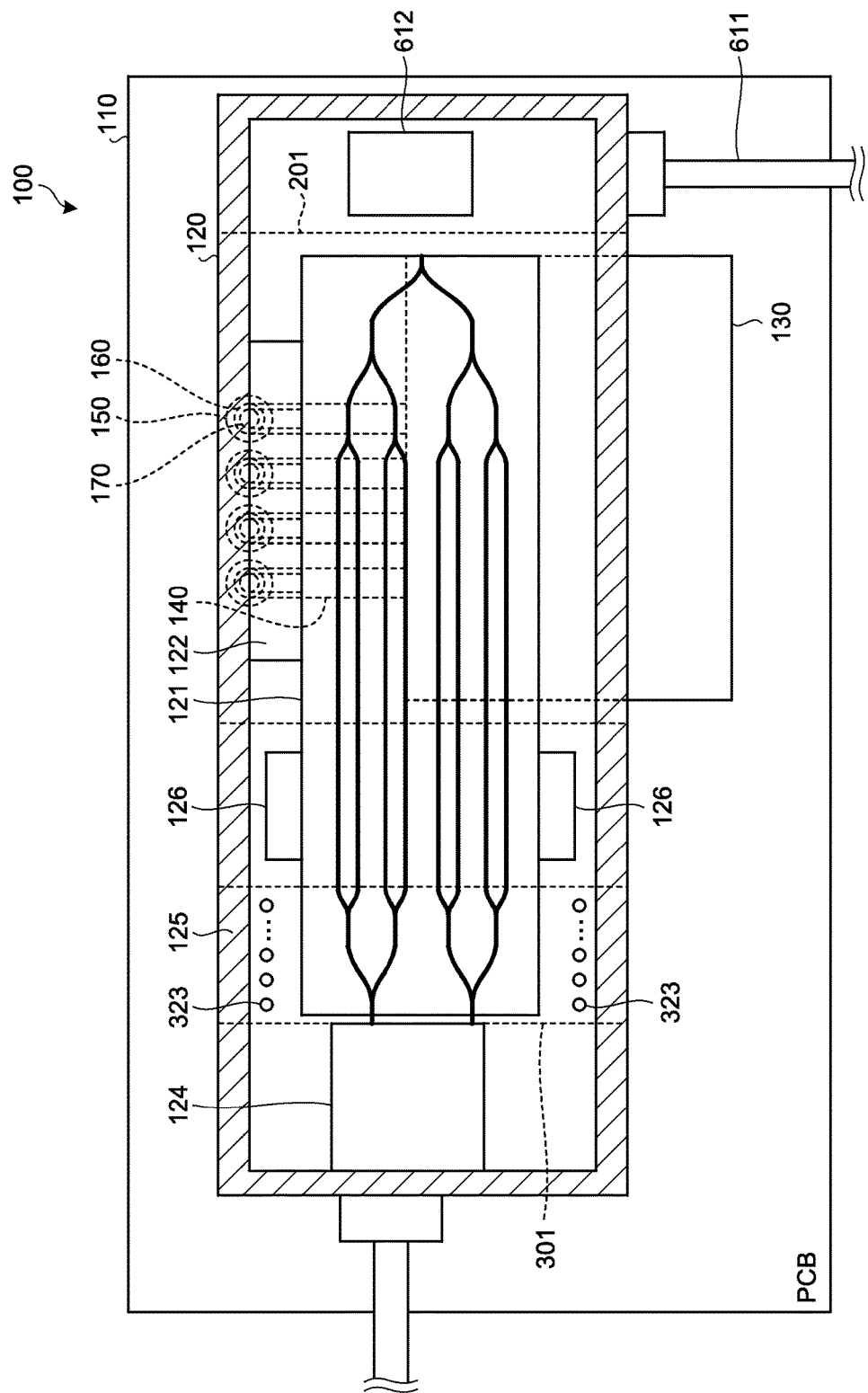
FIG. 14 is a diagram illustrating a first modification of an arrangement of optical fibers.

Further, in order to reduce the length of the optical modulator 120 in the longitudinal direction, an input-side optical fiber may be arranged on one of side surfaces of the package 125 of the optical modulator 120, the one side surface being parallel to the longitudinal direction. In this case, as illustrated in FIG. 14, for example, an input-side optical fiber 611 and the modulator chip 121 of the optical modulator 120 are optically connected to each other via an optical-path converter 612. The optical-path converter 612 performs optical path conversion for light output from the input-side optical fiber 611 in such a manner that the light travels in the longitudinal direction of the optical modulator 120, and outputs the light after being subjected to optical path conversion to the modulator chip 121. This configuration can reduce the length of the optical modulator 120 in the longitudinal direction. FIG. 14 is a diagram illustrating a first modification of an arrangement of optical fibers.

Figure 15:
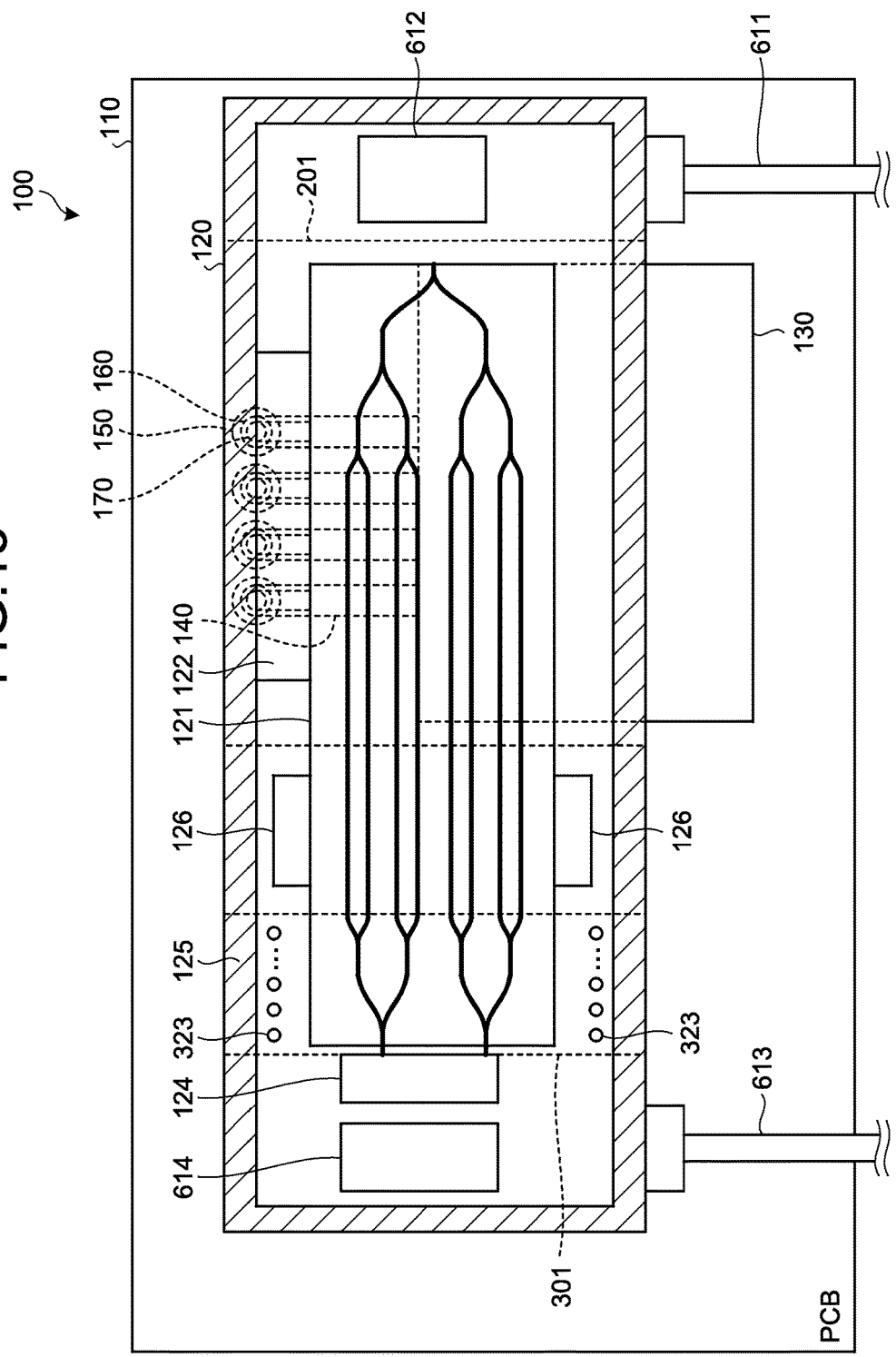
FIG. 15 is a diagram illustrating a second modification of the arrangement of the optical fibers.

In the configuration of FIG. 14, an output-side optical fiber is provided in the longitudinal direction of the optical modulator 120, and the length of the optical modulator 120 in the longitudinal direction increases by a length corresponding to the output-side optical fiber. Therefore, as illustrated in FIG. 15, for example, an output-side optical fiber 613 may be arranged on the side surface of the package 125 of the optical modulator 120, on which the input-side optical fiber 611 is arranged. In this case, the output-side optical fiber 613 and the modulator chip 121 of the optical modulator 120 are optically connected to each other via the PBC 124 and an optical-path converter 614. The optical-path converter 614 performs optical path conversion for light (an optical signal) output from the PBC 124 in such a manner that the light travels in the transverse direction of the optical modulator 120, and outputs the light after being subjected to optical path conversion to the output-side optical fiber 613. This configuration can further reduce the length of the optical modulator 120 in the longitudinal direction. FIG. 15 is a diagram illustrating a second modification of the arrangement of the optical fibers.

In addition, in the third embodiment described above, the DC terminal 323 projects to the another notch 301 of the package 125 of the optical modulator 120, and is connected to the electrode pattern 303 on the PCB 110 via the connector 302 in the another notch 301. However, a connecting structure between the DC terminal 323 and the electrode pattern 303 on the PCB 110 is not limited thereto. Modifications of the connecting structure between the DC terminal 323 and the electrode pattern 303 on the PCB 110 are described below, with reference to FIGS. 16 to 25.

Figure 16:
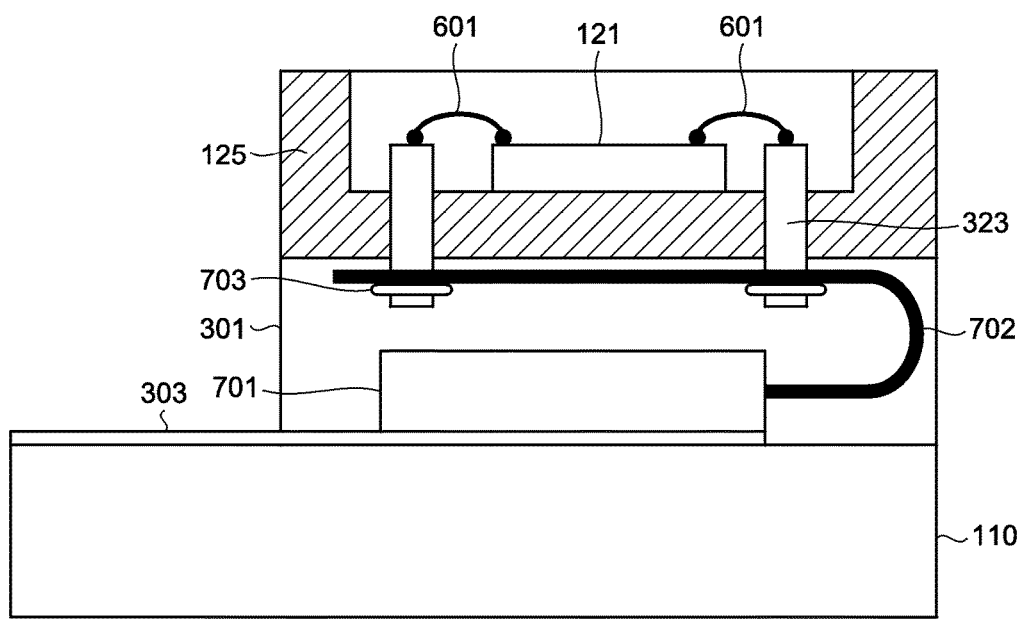
FIG. 16 is a diagram illustrating a first modification of a connecting structure between a DC terminal and an electrode pattern on a PCB.

FIG. 16 is a diagram illustrating a first modification of a connecting structure between a DC terminal and an electrode pattern on a PCB. In the first modification illustrated in FIG. 16, a connector 701 is fixed to the electrode pattern 303 on the PCB 110, and one end of a flexible printed circuit (FPC) 702 is inserted into the connector 701. The other end of the FPC 702 is bent in the another notch 301 of the package 125 of the optical modulator 120 and is connected to the DC terminal 323 of the optical modulator 120 by solder 703. In other words, the DC terminal 323 of the optical modulator 120 penetrates a through hole formed in the FPC 702 and is connected to the FPC 702 by the solder 703 on a PCB 110-side surface of the FPC 702. Due to this configuration, the DC terminal 323 and the electrode pattern 303 on the PCB 110 are electrically connected to each other. In the example illustrated in FIG. 16, the FPC 702 can be replaced with another conductive member, for example, a lead wire.

Figure 17:
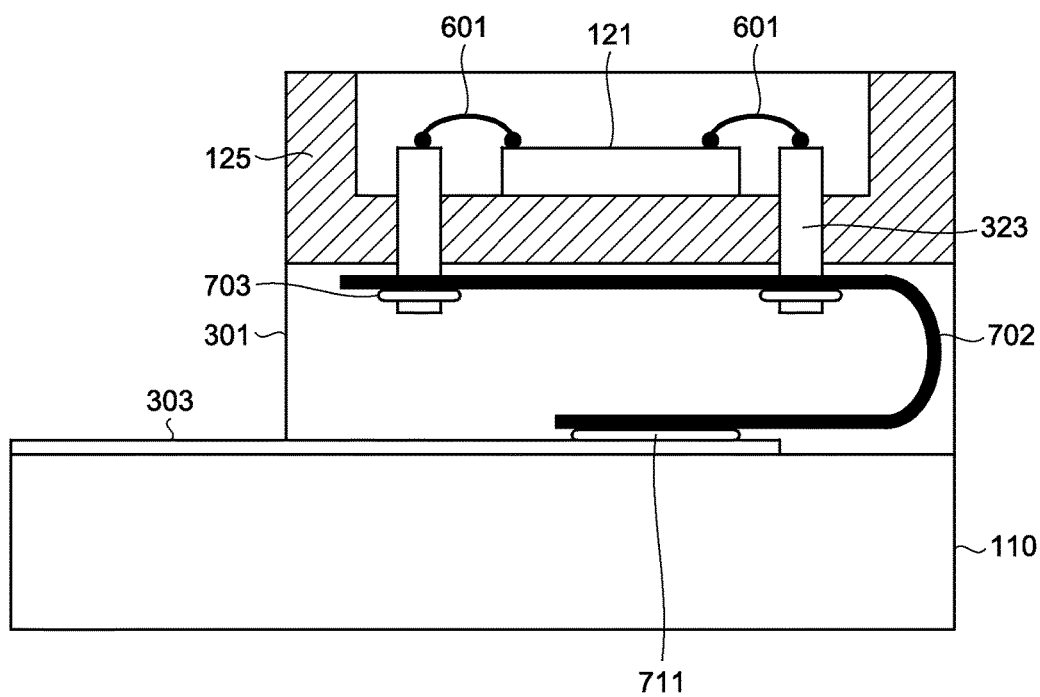
FIG. 17 is a diagram illustrating a second modification of the connecting structure between the DC terminal and the electrode pattern on the PCB.

FIG. 17 is a diagram illustrating a second modification of the connecting structure between the DC terminal and the electrode pattern on the PCB. In the second modification illustrated in FIG. 17, one end of the FPC 702 is connected to the electrode pattern 303 on the PCB 110 by solder 711. The other end of the FPC 702 is bent in the another notch 301 of the package 125 of the optical modulator 120 and is connected to the DC terminal 323 of the optical modulator 120 by the solder 703. In other words, the DC terminal 323 of the optical modulator 120 penetrates a through hole formed in the FPC 702 and is connected to the FPC 702 by the solder 703 on a PCB 110-side surface of the FPC 702. Due to this configuration, the DC terminal 323 and the electrode pattern 303 on the PCB 110 are electrically connected to each other. In the example illustrated in FIG. 17, the FPC 702 can be replaced with another conductive member, for example, a lead wire.

Figure 18:
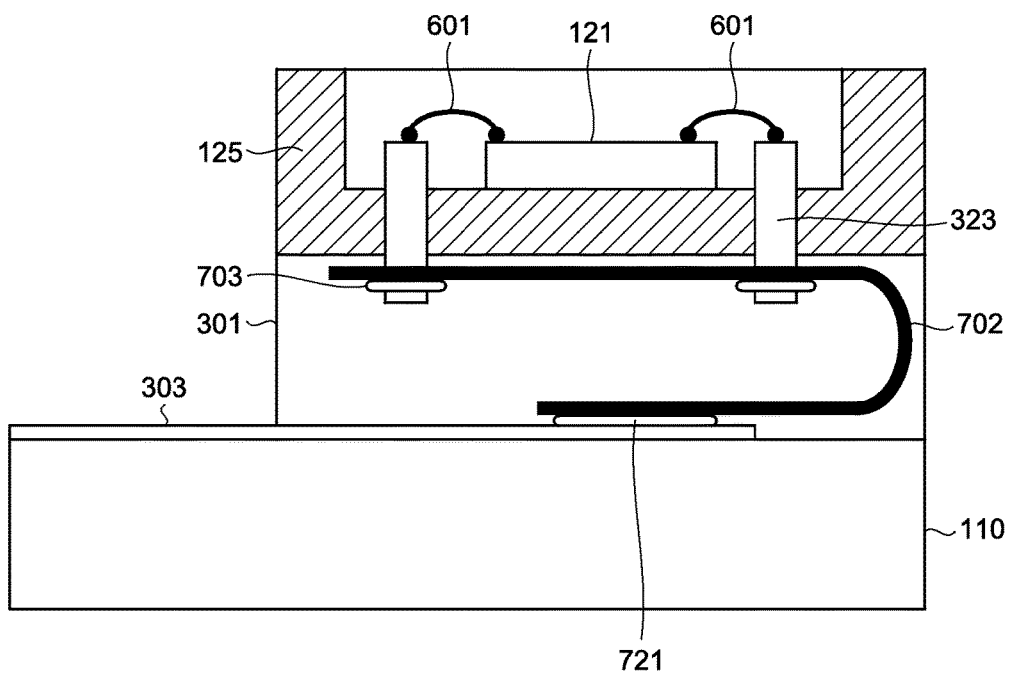
FIG. 18 is a diagram illustrating a third modification of the connecting structure between the DC terminal and the electrode pattern on the PCB.

FIG. 18 is a diagram illustrating a third modification of the connecting structure between the DC terminal and the electrode pattern on the PCB. In the third modification illustrated in FIG. 18, one end of the FPC 702 is connected to the electrode pattern 303 on the PCB 110 by an anisotropic conductive film 721. The other end of the FPC 702 is bent in the another notch 301 of the package 125 of the optical modulator 120 and is connected to the DC terminal 323 of the optical modulator 120 by the solder 703. In other words, the DC terminal 323 of the optical modulator 120 penetrates a through hole formed in the FPC 702 and is connected to the FPC 702 by the solder 703 on a PCB 110-side surface of the FPC 702. Due to this configuration, the DC terminal 323 and the electrode pattern 303 on the PCB 110 are electrically connected to each other. In the example illustrated in FIG. 18, the FPC 702 can be replaced with another conductive member, for example, a lead wire.

Figure 19:
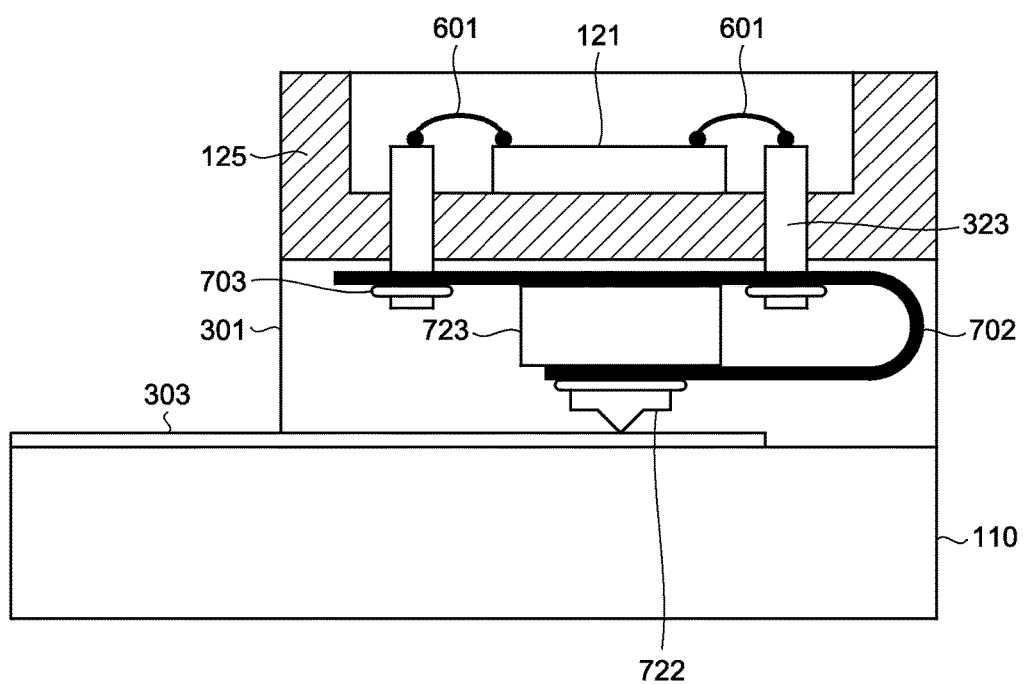
FIG. 19 is a diagram illustrating a fourth modification of the connecting structure between the DC terminal and the electrode pattern on the PCB.

FIG. 19 is a diagram illustrating a fourth modification of the connecting structure between the DC terminal and the electrode pattern on the PCB. In the fourth modification illustrated in FIG. 19, the DC terminal 323 of the optical modulator 120 penetrates a through hole formed in the FPC 702 and is connected to the FPC 702 by the solder 703 on a PCB 110-side surface of the FPC 702. The FPC 702 is bent in the another notch 301 of the package 125 of the optical modulator 120. To one end of the FPC 702, a contact member 722 is soldered. The contact member 722 comes into contact with the electrode pattern 303 on the PCB 110 in association with bending of the FPC 702. Further, an elastic member 723 is inserted between a pair of opposed surfaces that are made opposed in association with bending of the FPC 702. The elastic member 723 presses the contact member 722 to the electrode pattern 303 on the PCB 110. Due to this configuration, the DC terminal 323 and the electrode pattern 303 on the PCB 110 are electrically connected to each other. In the example illustrated in FIG. 19, the FPC 702 can be replaced with another conductive member, for example, a lead wire.

Figure 20:
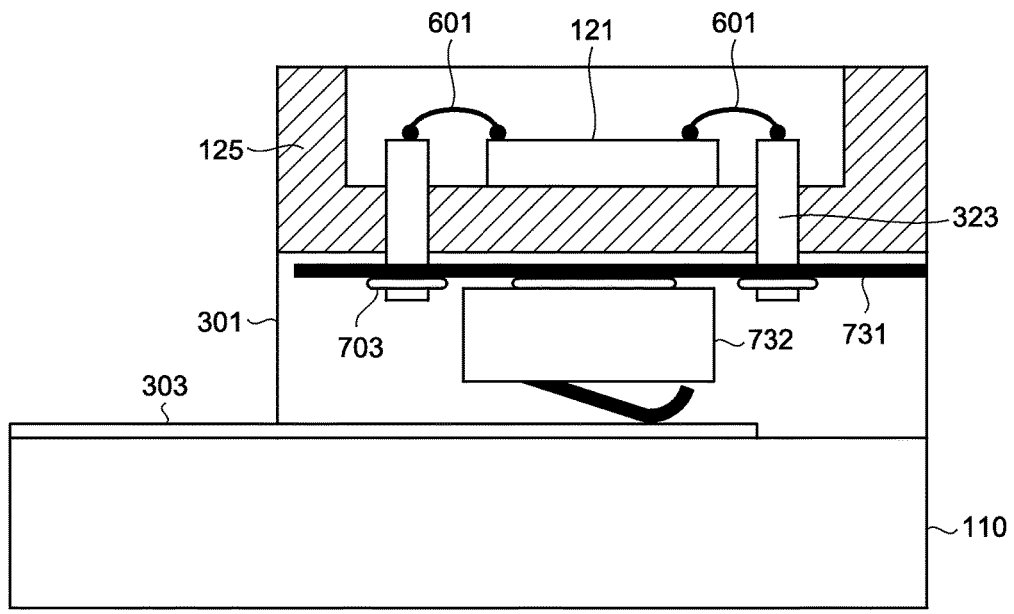
FIG. 20 is a diagram illustrating a fifth modification of the connecting structure between the DC terminal and the electrode pattern on the PCB.

FIG. 20 is a diagram illustrating a fifth modification of the connecting structure between the DC terminal and the electrode pattern on the PCB. In the fifth modification illustrated in FIG. 20, the DC terminal 323 of the optical modulator 120 penetrates a through hole formed in a FPC 731 and is connected to the FPC 731 by solder 703 on a PCB 110-side surface of the FPC 731. To the PCB 110-side surface of the FPC 731, a spring contact member 732 is fixed. The spring contact member 732 has a spring property and comes into elastic contact with the electrode pattern 303 on the PCB 110. Due to this configuration, the DC terminal 323 and the electrode pattern 303 on the PCB 110 are electrically connected to each other. In the example illustrated in FIG. 20, the FPC 731 can be replaced with a rigid substrate.

Figure 21:
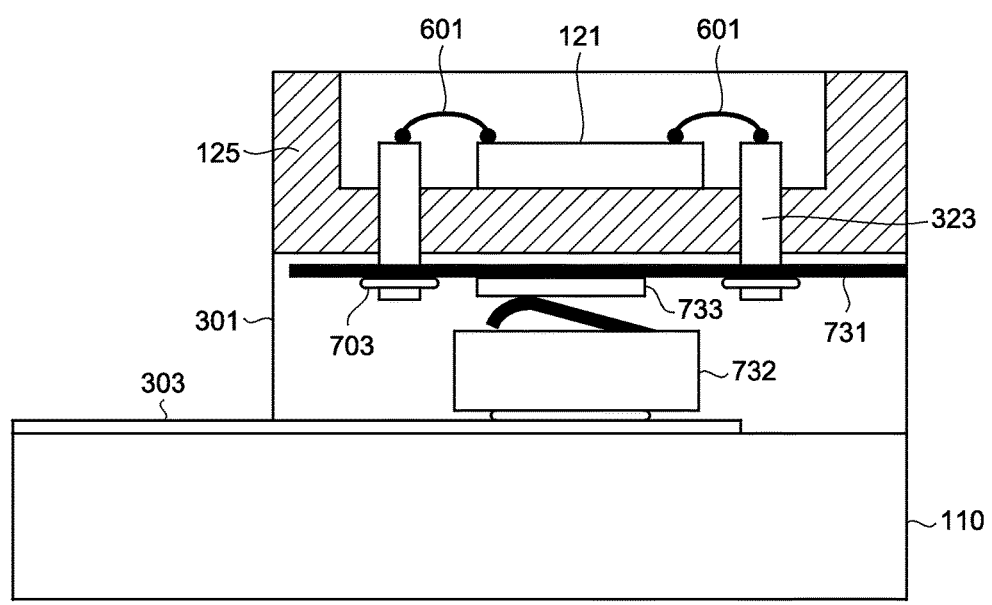
FIG. 21 is a diagram illustrating a sixth modification of the connecting structure between the DC terminal and the electrode pattern on the PCB.

FIG. 21 is a diagram illustrating a sixth modification of the connecting structure between the DC terminal and the electrode pattern on the PCB. In the sixth modification illustrated in FIG. 21, the DC terminal 323 of the optical modulator 120 penetrates a through hole formed in the FPC 731 and is connected to the FPC 731 by solder 703 on a PCB 110-side surface of the FPC 731. The PCB 110-side surface of the FPC 731 has an electrode pattern 733 formed thereon. To the electrode pattern 303 on the PCB 110, the spring contact member 732 is fixed. The spring contact member 732 has a spring property and comes into elastic contact with the electrode pattern 733 of the FPC 731. Due to this configuration, the DC terminal 323 and the electrode pattern 303 on the PCB 110 are electrically connected to each other. In the example illustrated in FIG. 21, the FPC 731 can be replaced with a rigid substrate.

Figure 22:
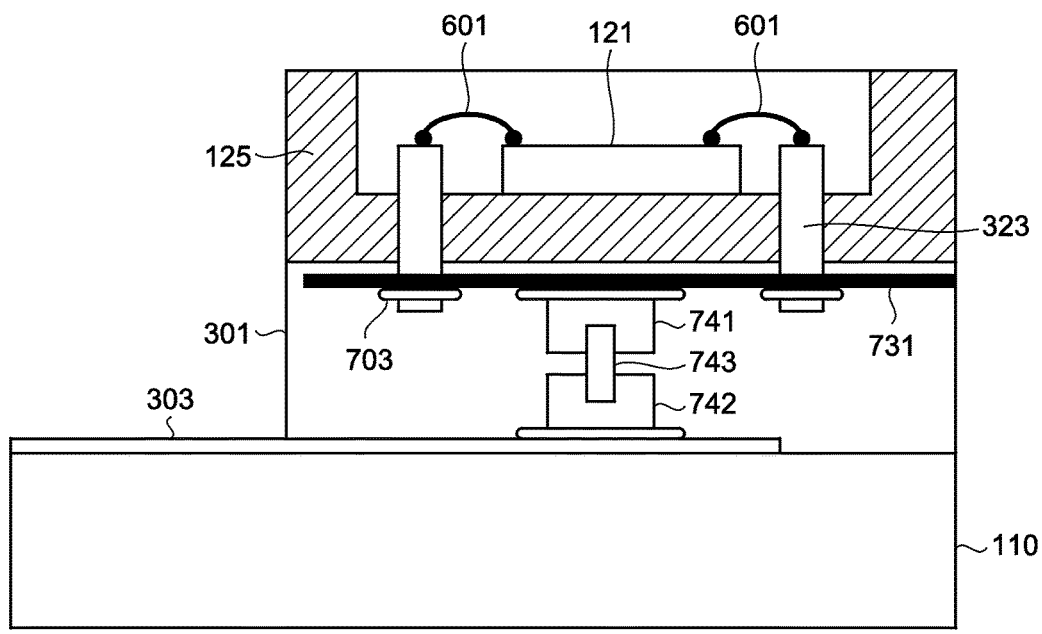
FIG. 22 is a diagram illustrating a seventh modification of the connecting structure between the DC terminal and the electrode pattern on the PCB.

FIG. 22 is a diagram illustrating a seventh modification of the connecting structure between the DC terminal and the electrode pattern on the PCB. In the seventh modification illustrated in FIG. 22, the DC terminal 323 of the optical modulator 120 penetrates a through hole formed in the FPC 731 and is connected to the FPC 731 by solder 703 on a PCB 110-side surface of the FPC 731. A connector 741 is soldered to the PCB 110-side surface of the FPC 731, while a connector 742 is soldered to the electrode pattern 303 on the PCB 110. Further, a conductive pin 743 that is electrically conductive is connected to the connector 741 and the connector 742, so that the connector 741 and the connector 742 are electrically connected to each other via the conductive pin 743. Due to this configuration, the DC terminal 323 and the electrode pattern 303 on the PCB 110 are electrically connected to each other. In the example illustrated in FIG. 22, the conductive pin 743 can be replaced with a coaxial pin.

Figure 23:
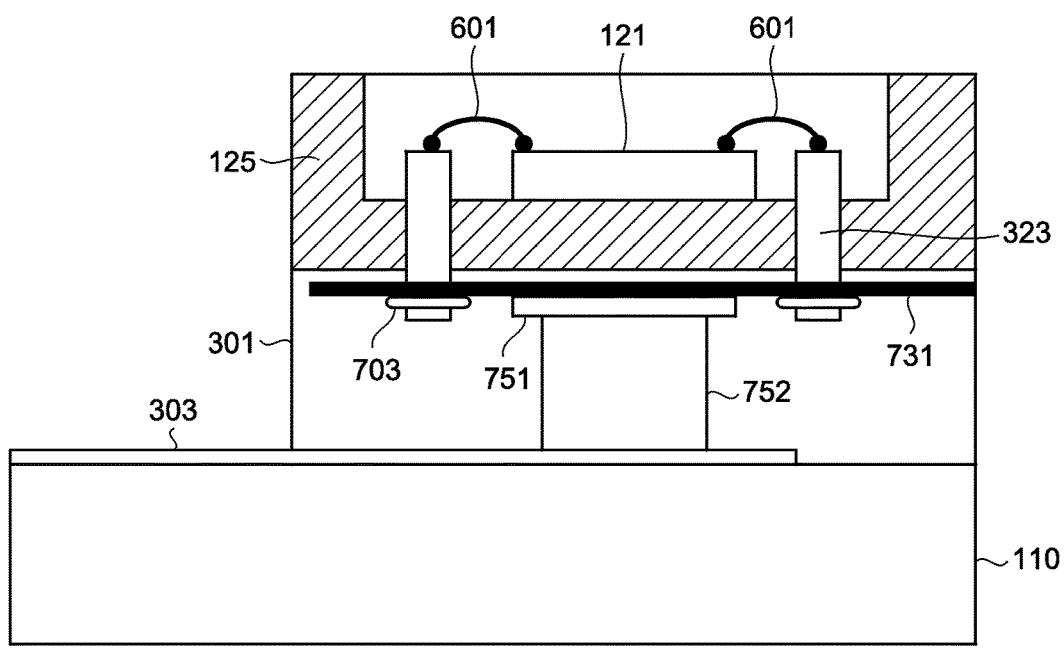
FIG. 23 is a diagram illustrating an eighth modification of the connecting structure between the DC terminal and the electrode pattern on the PCB.

FIG. 23 is a diagram illustrating an eighth modification of the connecting structure between the DC terminal and the electrode pattern on the PCB. In the eighth modification illustrated in FIG. 23, the DC terminal 323 of the optical modulator 120 penetrates a through hole formed in the FPC 731 and is connected to the FPC 731 by solder 703 on a PCB 110-side surface of the FPC 731. The PCB 110-side surface of the FPC 731 has an electrode pattern 751 formed thereon. Between the electrode pattern 751 of the FPC 731 and the electrode pattern 303 on the PCB 110, an elastic material 752 that is electrically conductive is inserted. The elastic material 752 is formed of conductive rubber, conductive elastomer, or conductive silicon, for example. Due to this configuration, the DC terminal 323 and the electrode pattern 303 on the PCB 110 are electrically connected to each other. In the example illustrated in FIG. 23, the FPC 731 can be replaced with a rigid substrate.

Figure 24:
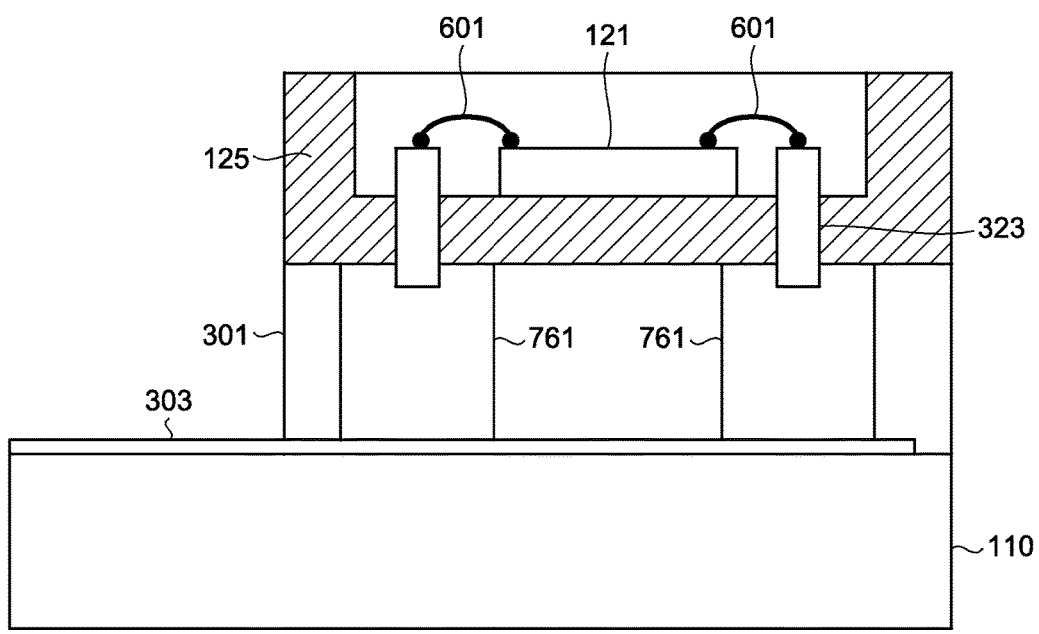
FIG. 24 is a diagram illustrating a ninth modification of the connecting structure between the DC terminal and the electrode pattern on the PCB.

FIG. 24 is a diagram illustrating a ninth modification of the connecting structure between the DC terminal and the electrode pattern on the PCB. In the ninth modification illustrated in FIG. 24, an elastic material 761 that is electrically conductive is arranged at a tip of the DC terminal 323 of the optical modulator 120. The elastic material 761 is formed of conductive rubber, conductive elastomer, or conductive silicon, for example. The DC terminal 323 and the electrode pattern 303 come into elastic contact with each other via the elastic material 761. Due to this configuration, the DC terminal 323 and the electrode pattern 303 on the PCB 110 are electrically connected to each other.

Figure 25:
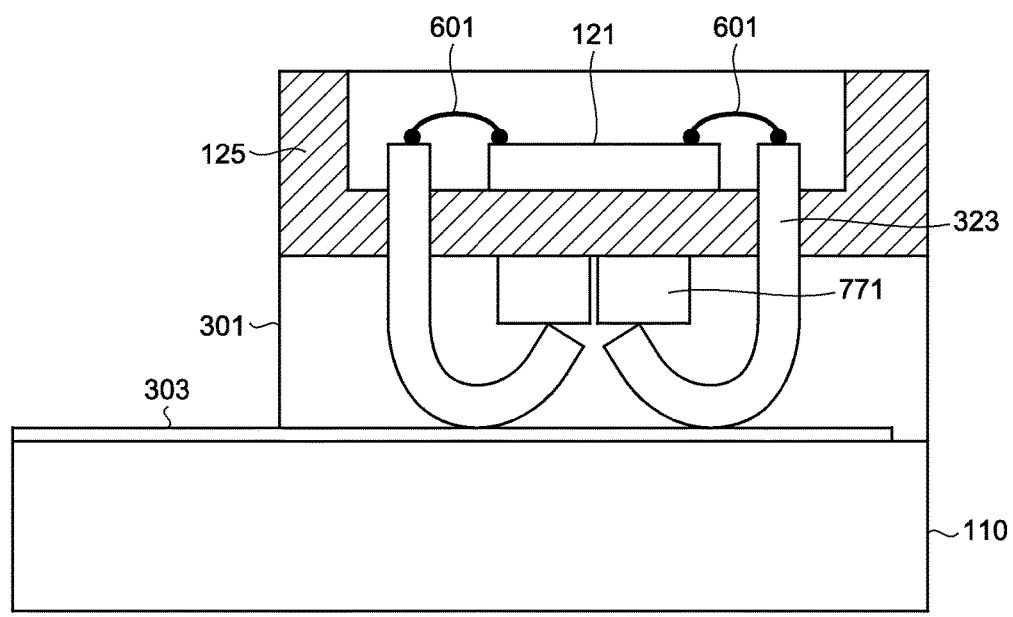
FIG. 25 is a diagram illustrating a tenth modification of the connecting structure between the DC terminal and the electrode pattern on the PCB.

FIG. 25 is a diagram illustrating a tenth modification of the connecting structure between the DC terminal and the electrode pattern on the PCB. In the tenth modification illustrated in FIG. 25, the DC terminal 323 of the optical modulator 120 is bent at a portion near its tip to form a spring contact, and the bent portion of the DC terminal 323 comes into contact with the electrode pattern 303 on the PCB 110. Further, between the tip of the DC terminal 323 and an upper surface of the another notch 301, an elastic material 771 is inserted, so that excessive bending of the DC terminal 323 is prevented. Due to this configuration, the DC terminal 323 and the electrode pattern 303 on the PCB 110 are electrically connected to each other. The elastic material 771 can be omitted in the example illustrated in FIG. 25.

According to an aspect of the optical module disclosed in the present application, it is possible to provide an optical module that can improve high-frequency characteristics while reducing a mounting area.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An optical module comprising:
a driver that generates an electric signal;

an optical modulator that includes a notch in which at least a portion of the driver is accommodated, and performs optical modulation using the electric signal generated by the driver;

a first connector that is electrically connected to the driver in the notch of the optical modulator;

a second connector that is provided on a surface of the notch of the optical modulator and is electrically connected to the optical modulator, the surface being opposed to the first connector; and a coaxial pin that is connected to the first connector and the second connector and transmits the electric signal generated by the driver to the optical modulator.

2. The optical module according to claim 1, wherein the first connector is fixed to a substrate with an insertion port thereof facing a thickness direction of the substrate in the notch of the optical modulator, and is electrically connected to the driver via a first electrode pattern on the substrate, the second connector is provided on the surface of the notch of the optical modulator, the surface being opposed to the first connector, with an insertion port thereof facing the thickness direction of the substrate and is electrically connected to the optical modulator, and the coaxial pin is connected to the first connector and the second connector by being inserted into the insertion port of the first connector and the insertion port of the second connector.

3. The optical module according to claim 2, wherein the first connector is fixed to the substrate via a base member on which a plurality of the first connectors are arranged in an array.

4. The optical module according to claim 1, wherein the first connector is fixed to the driver with an insertion port thereof facing a direction crossing a thickness direction of a substrate in the notch of the optical modulator, and is electrically connected to the driver, the second connector is provided on the surface of the notch of the optical modulator, the surface being opposed to the first connector, with an insertion port thereof facing the direction crossing the thickness direction of the substrate and is electrically connected to the optical modulator, and the coaxial pin is connected to the first connector and the second connector by being inserted into the insertion port of the first connector and the insertion port of the second connector.

5. The optical module according to claim 2, wherein the optical modulator further includes another notch different from the notch and a terminal that is for inputting a signal different from the electric signal and projects to the another notch, and the terminal is electrically connected to a second electrode pattern on the substrate in the another notch of the optical modulator.

6. The optical module according to claim 4, wherein the optical modulator further includes another notch different from the notch and a terminal that is for inputting a signal different from the electric signal and projects to the another notch, and the terminal is electrically connected to a second electrode pattern on the substrate in the another notch of the optical modulator.

7. The optical module according to claim 1, wherein the first connector and the coaxial pin are integrally formed with each other.

8. The optical module according to claim 1, wherein the second connector and the coaxial pin are integrally formed with each other.

* * * * *